(12) United States Patent
Schricker et al.

(10) Patent No.: US 7,846,785 B2
(45) Date of Patent: Dec. 7, 2010

(54) MEMORY CELL THAT EMPLOYS A SELECTIVELY DEPOSITED REVERSIBLE RESISTANCE-SWITCHING ELEMENT AND METHODS OF FORMING THE SAME

(75) Inventors: April Schricker, Fremont, CA (US); Brad Herner, San Jose, CA (US); Michael W. Konevecki, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 34 days.

(21) Appl. No.: 11/772,090

(22) Filed: Jun. 29, 2007

(65) Prior Publication Data

US 2009/0001345 A1 Jan. 1, 2009

(51) Int. Cl.
*H01L 21/00* (2006.01)
*H01L 21/84* (2006.01)

(52) U.S. Cl. .................. 438/149; 438/141; 438/238; 438/381; 257/E21.17; 257/E21.229; 257/E21.334; 257/E21.352; 257/E21.361; 257/E21.372

(58) Field of Classification Search .......... 438/91, 438/141, 210, 238, 381, 149, 680, 692, 706, 438/682, 745, 679; 257/E21.17, 229, 334, 257/352, 361, 372
See application file for complete search history.

(56) References Cited

U.S. PATENT DOCUMENTS

| 2,655,609 | A | 10/1953 | Shockley |
| 2,971,140 | A | 12/1959 | Chappey et al. |
| 3,796,926 | A | 3/1974 | Cole et al. |
| 4,204,028 | A | 5/1980 | Donley |
| 4,499,557 | A | 2/1985 | Holmberg et al. |
| 4,646,266 | A | 2/1987 | Ovshinsky et al. |
| 4,772,571 | A | 9/1988 | Scovell et al. |
| 4,907,054 | A | 3/1990 | Berger |
| 4,940,553 | A | 7/1990 | von Benda |
| 5,037,200 | A | 8/1991 | Kodama |
| 5,166,758 | A | 11/1992 | Ovshinsky et al. |
| 5,273,915 | A | 12/1993 | Hwang et al. |
| 5,311,055 | A | 5/1994 | Goodman et al. |
| 5,774,394 | A | 6/1998 | Chen et al. |

(Continued)

FOREIGN PATENT DOCUMENTS

EP 1 308 960 A2 5/2003

(Continued)

OTHER PUBLICATIONS

Hiatt et al., "Bistable Switching In Niobium Oxide Diodes", Mar. 15, 1965, Applied Physics Lettes, AIP, American Institute of Physics, Melville, NY, US, vol. 6, No. 6, pp. 106-108.

(Continued)

*Primary Examiner*—David Nhu
(74) *Attorney, Agent, or Firm*—Dugan & Dugan, P.C.

(57) ABSTRACT

In some aspects, a method of forming a memory cell is provided that includes (1) forming a first conductor above a substrate; (2) forming a diode above the first conductor; (3) forming a reversible resistance-switching element above the first conductor using a selective deposition process; and (4) forming a second conductor above the diode and the reversible resistance-switching element. Numerous other aspects are provided.

20 Claims, 9 Drawing Sheets

U.S. PATENT DOCUMENTS

| | | | |
|---|---|---|---|
| 5,876,788 A | 3/1999 | Bronner et al. | |
| 5,915,167 A | 6/1999 | Leedy | |
| 6,034,882 A | 3/2000 | Johnson et al. | |
| RE37,259 E | 7/2001 | Ovshinsky | |
| 6,369,431 B1 | 4/2002 | Gonzalez et al. | |
| 6,426,891 B1 | 7/2002 | Katori | |
| 6,465,370 B1 | 10/2002 | Schrems | |
| 6,483,734 B1 | 11/2002 | Sharma et al. | |
| 6,534,841 B1 | 3/2003 | Van Brocklin et al. | |
| 6,541,792 B1 | 4/2003 | Tran et al. | |
| 6,707,698 B2 | 3/2004 | Fricke et al. | |
| 6,753,561 B1 | 6/2004 | Rinerson et al. | |
| 6,761,985 B2 | 7/2004 | Windisch et al. | |
| 6,774,458 B2 | 8/2004 | Fricke et al. | |
| 6,778,441 B2 | 8/2004 | Forbes et al. | |
| 6,787,401 B2 | 9/2004 | Gonzalez et al. | |
| 6,798,685 B2 | 9/2004 | Rinerson et al. | |
| 6,815,744 B1 | 11/2004 | Beck et al. | |
| 6,831,854 B2 | 12/2004 | Rinerson et al. | |
| 6,834,008 B2 | 12/2004 | Rinerson et al. | |
| 6,836,421 B2 | 12/2004 | Rinerson et al. | |
| 6,850,429 B2 | 2/2005 | Rinerson et al. | |
| 6,850,455 B2 | 2/2005 | Rinerson et al. | |
| 6,856,536 B2 | 2/2005 | Rinerson et al. | |
| 6,859,382 B2 | 2/2005 | Rinerson et al. | |
| 6,870,755 B2 | 3/2005 | Rinerson et al. | |
| 6,946,719 B2 | 9/2005 | Petti et al. | |
| 6,952,030 B2* | 10/2005 | Herner et al. | 257/313 |
| 7,116,573 B2 | 10/2006 | Sakamoto et al. | |
| 7,176,064 B2* | 2/2007 | Herner | 438/131 |
| 7,215,564 B2 | 5/2007 | Happ et al. | |
| 7,224,013 B2 | 5/2007 | Herner et al. | |
| 7,238,607 B2* | 7/2007 | Dunton et al. | 438/626 |
| 7,265,049 B2* | 9/2007 | Herner et al. | 438/653 |
| 7,307,268 B2 | 12/2007 | Scheuerlein | |
| 7,391,064 B1 | 6/2008 | Tripsas et al. | |
| 7,405,465 B2 | 7/2008 | Herner | |
| 7,501,331 B2* | 3/2009 | Herner | 438/486 |
| 7,575,984 B2 | 8/2009 | Radigan et al. | |
| 2002/0057594 A1 | 5/2002 | Hirai | |
| 2003/0013007 A1 | 1/2003 | Kaun | |
| 2003/0047727 A1 | 3/2003 | Chiang | |
| 2003/0081446 A1 | 5/2003 | Fricke et al. | |
| 2003/0209971 A1 | 11/2003 | Kozicki | |
| 2004/0002186 A1 | 1/2004 | Vyvoda et al. | |
| 2004/0084743 A1 | 5/2004 | Vanbuskirk et al. | |
| 2004/0095300 A1 | 5/2004 | So et al. | |
| 2004/0159828 A1 | 8/2004 | Rinerson et al. | |
| 2004/0159867 A1 | 8/2004 | Kinney et al. | |
| 2004/0159869 A1 | 8/2004 | Rinerson et al. | |
| 2004/0160798 A1 | 8/2004 | Rinerson et al. | |
| 2004/0160804 A1 | 8/2004 | Rinerson et al. | |
| 2004/0160805 A1 | 8/2004 | Rinerson et al. | |
| 2004/0160806 A1 | 8/2004 | Rinerson et al. | |
| 2004/0160807 A1 | 8/2004 | Rinerson et al. | |
| 2004/0160808 A1 | 8/2004 | Rinerson et al. | |
| 2004/0160812 A1 | 8/2004 | Rinerson et al. | |
| 2004/0160817 A1 | 8/2004 | Rinerson et al. | |
| 2004/0160818 A1 | 8/2004 | Rinerson et al. | |
| 2004/0160819 A1 | 8/2004 | Rinerson et al. | |
| 2004/0161888 A1 | 8/2004 | Rinerson et al. | |
| 2004/0170040 A1 | 9/2004 | Rinerson et al. | |
| 2004/0228172 A1 | 11/2004 | Rinerson et al. | |
| 2004/0245557 A1 | 12/2004 | Seo et al. | |
| 2005/0045919 A1 | 3/2005 | Kaeriyama et al. | |
| 2005/0058009 A1 | 3/2005 | Yang | |
| 2005/0158950 A1* | 7/2005 | Scheuerlein et al. | 438/257 |
| 2005/0167699 A1 | 8/2005 | Sugita | |
| 2005/0247921 A1 | 11/2005 | Lee et al. | |
| 2005/0286211 A1 | 12/2005 | Pinnow et al. | |
| 2006/0006495 A1 | 1/2006 | Herner et al. | |
| 2006/0067117 A1 | 3/2006 | Petti | |
| 2006/0094236 A1 | 5/2006 | Elkins | |
| 2006/0098472 A1 | 5/2006 | Ahn et al. | |
| 2006/0128153 A1 | 6/2006 | Dunton et al. | |
| 2006/0157679 A1 | 7/2006 | Scheuerlein | |
| 2006/0164880 A1 | 7/2006 | Sakamoto et al. | |
| 2006/0250836 A1 | 11/2006 | Herner et al. | |
| 2006/0250837 A1* | 11/2006 | Herner et al. | 365/148 |
| 2006/0268594 A1 | 11/2006 | Toda | |
| 2006/0273298 A1 | 12/2006 | Petti | |
| 2007/0010100 A1 | 1/2007 | Raghuram et al. | |
| 2007/0072360 A1 | 3/2007 | Kumar et al. | |
| 2007/0114508 A1 | 5/2007 | Herner et al. | |
| 2007/0114509 A1 | 5/2007 | Herner | |
| 2007/0190722 A1 | 8/2007 | Herner | |
| 2007/0228354 A1 | 10/2007 | Scheuerlein | |
| 2007/0228414 A1 | 10/2007 | Kumar | |
| 2007/0236981 A1 | 10/2007 | Herner | |
| 2007/0246743 A1 | 10/2007 | Cho et al. | |
| 2008/0175032 A1 | 7/2008 | Tanaka et al. | |
| 2009/0001342 A1* | 1/2009 | Schricker et al. | 257/4 |
| 2009/0001343 A1 | 1/2009 | Schricker et al. | |
| 2009/0001344 A1 | 1/2009 | Schricker et al. | |
| 2009/0104756 A1 | 4/2009 | Kumar | |
| 2009/0236581 A1 | 9/2009 | Yoshida et al. | |

FOREIGN PATENT DOCUMENTS

| | | |
|---|---|---|
| EP | 1 484 799 A2 | 12/2004 |
| EP | 1 513 159 A2 | 3/2005 |
| EP | 1 914 806 A1 | 4/2008 |
| GB | 1 284 645 | 8/1972 |
| GB | 1 416 644 | 12/1975 |
| GB | 1416644 | 12/1975 |
| JP | 62042582 | 2/1987 |
| KR | 100 717 286 B1 | 5/2007 |
| WO | WO 97/41606 | 11/1997 |
| WO | WO 00/49659 A1 | 8/2000 |
| WO | WO 01/69655 A2 | 9/2001 |
| WO | WO 03/079463 A2 | 9/2003 |
| WO | WO 2004/084229 A1 | 9/2004 |
| WO | WO 2005/008783 A1 | 1/2005 |
| WO | WO 2005/024839 | 3/2005 |
| WO | WO 2006/078505 A2 | 7/2006 |
| WO | WO 2007/004843 A1 | 1/2007 |
| WO | WO 2007/018026 A1 | 2/2007 |
| WO | WO 2007/038709 | 4/2007 |
| WO | WO 2007/062022 A1 | 5/2007 |
| WO | WO 2007/067448 A1 | 6/2007 |
| WO | WO 2007/072308 A1 | 6/2007 |
| WO | WO 2008/097742 | 8/2008 |

OTHER PUBLICATIONS

Hwang et al., "Molecular Dynamics Simulations of Nanomemory Element Based on Boron-Nitride Nanotube-To-Peapod Transition", Apr. 2005, Computational Materials Science, Elsevier, Amsterdam, NL, vol. 33, No. 1-3, pp. 317-324.

Prince, B, "Trends in Scaled and Nanotechnology Memories", Sep. 2005, Non-Volatile Memory Technology Symposium, IEEE, Piscataway, NJ, USA, pp. 55-61.

Mime, Liti, "ReRAM with Erase/Read Speed of 3 ns, Applicable as Multi-level Oell", Dec. 26, 2006, Nikkei Electronics, <http://techon.nikkeibp.co.jp/english/NEWS_EN/20061226/125918/>; pp. 1-2.

Baek et al., "Multi-layer Cross-point Binary Oxide Resistive Memory (OxRRAM) for Post-NAND Storage Application," 2005, pp. 1-4, IEEE.

Baek. I.G.,et al., Highly Scalable Non-volatile Resistive Memory Using Simple Binary Oxide Driven By Asymmetric Unipolar Voltage Pulese; IEDM (2004), (Jan. 2004), 587-590.

Beck, et al., "Reproducible Switching Effect in Thin Oxide Films for Memory Applications," Applied Physics Letters, vol. 77, No. 1, Jul. 3, 2000, pp. 139-141, XP00958527, ISSN: 0003-6951.

Bruyere et al., "Switching and Negative Resistance in Thin Films of Nickel Oxide", Applied Physics Letters, vol. 16, No. 1, Jan. 1, 1970, pp. 40-43.

Pagnia, H., et al., "Bistable switching in Electroformed Metal-Insulator-Metal Devices", Phvs. Stat. Sol. A 108 11 (1988), 10-65.

Park, Jae-Wan., et at. "Reproducible resistive switching in nonstoichiometric nickel oxide films grown by rf reactive sputtering for resistive random access memory applications", J. Vac. Sci. Technol. A 23(5). (Sep./Oct. 2005), 1309-1313.

Roginskaya et al., "Characterization of Bulk and Surface Composition of CoxNi1-xOy Mixed Oxides for Electrocatalysis", Langmuir, vol. 13, No. 17, 1997, pp. 4621-4627.

Scheuerlein et al., "A 10ns Read and Write Non-Volatile Memory Array Using a Magnetic Tunnel Junction and FET Switch in each Cell," 2000, IEEE International Solid-State Circuits Conference, pp. 1-2.

Seo, S., et al., "Reproducible resistance switching in polycrystalline NiO films", . Appl. Phys. Lett. vol. 85 No. 23 (2004), (Dec. 6, 2004), 5655-5657.

Seo, S., et al. "Conductivity switching characteristics and reset currents in NiO films", Appl. Phvs. Lett. 86 093509 (2005), 093509;093509-2;093509-3.

Sim et al., "Resistance Switching Characteristics of Polycrystalline Nb2O5 for Nonvolatile Memory Application", IEEE Electron Device Letters vol. 26, Issue 3, pp. 292-294 (2005), published May 2, 2005.

Windisch, et al., "Synthesis and Characterization of Transparent Conducting Oxide Cobalt-Nickel Spinel Films", Journal of Vacuum Science & Technology A, vol. 19, No. 4, Jul. 2001 pp. 1647-1651.

Dec. 10, 2008 International Search Report and Written Opinion of PCT/US2008/007986.

Malhi et al., "Characteristics and Three-Dimensional Integration of MOSFET's in Small-Grain LPCVD Polycrystalline Silicon", Feb. 1985, IEEE Journal of Solid-State Circuits, vol. sc-20, No. 1, pp. 178-201.

Choi et al., "Resistive Switching Mechanism of TiO2 Thin Films Grown by Atomic-Layer Deposition", 2005, Journal of Applied Physics 98, pp. 033715-1-033715-10.

Shih et al., "Study of Anodic Oxidation of Aluminum in Mixed Acid using a Pulsed Current", 2000, Surface and Coatings Technology 124, pp. 278-285.

F C Eze, "Electroless Depositioni of CoO Thin Films", J. Phys. D: Appl. Phys. 32 (1999), pp. 533-540.

Milgram, "Selective Surfaces of Anodic Copper Oxide for Solar Collectors" Jun. 1983, J. Appl. Phys. 54 (6), pp. 3640-3642.

Lu et al., "Study of the Electroless Deposition Process of Ni-P-Based Ternary Alloys", 2003, Journal of the Electrochemical Society, 150 (11), pp. C777-C786.

Osaka et al., "Electroless Nickel Ternary Alloy Deposition on SiO2 for Application to Diffusion Barrier Layer in Copper Interconnect Technology", 2002, Journal of the Electrochemical Society, 149(11), pp. C573-C578.

Han et al., "The Growth Mechanism of Nickel Oxide Thin Films by Room-Temperature Chemical Bath Deposition", 2006, Journal of the Electrochemical Society, 153 (6), pp. C382-C386.

G.P. Burns, "Titanium Dioxide Dielectric Films Formed by Rapid Thermal Oxidation", Mar. 1, 1989, J. Appl. Phys. 65 (5), pp. 2095-2097.

Fujimoto et al., "TiO2 Anatase Nanolayer on TiN Thin Film Exhibiting High-Speed Bipolar Resistive Switching", 2006, Applied Physics Letters 89, pp. 223509-1-223509-3.

Takano et al., "Mechanism of the Chemical Deposition of Nickel on Silicon Wafers in Aqueous Solution", 1999, Journal of the Electrochemical Society, 146 (4), pp. 1407-1411.

Abouatallah et al., "Characterization of Vanadium Deposit Formation at a Hydrogen Evolving Electrode in Alkaline Media", 2001, Journal of the Electrochemical Society, 148 (9), pp. E357-E363.

Christensen et al., "The Influence of Oxide on the Electrodeposition of Niobium from Alkali Fluoride Melts", May 1994, J. Electrochem. Soc., vol. 141, No. 5, pp. 1212-1220.

Lantelme et al., "Electrodeposition of Tantalum in NaCl-KCl-K2TzF7 Melts", May 1992, J. Electrochem. Soc., vol. 139, No. 5, pp. 1249-1255.

Herner et. al., "Vertical p-i-n Polysilicon Diode With Antifuse for Stackable Field-Programmable ROM", May 2004, IEEE Electron Device Letters, vol. 25, No. 5, pp. 271-273.

Nov. 9, 2007 Written Opinion of PCT/US2006/017376.

Nov. 6, 2006 International Search Report of PCT/US2006/017376.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDM Technical Digest, IEEE International Dec. 5, 2005, Piscataway, NJ, USA, pp. 758-761.

Ansari, et al., "Pre- and Post-Threshold Conduction Mechanisms in Thermally Grown Titanium Oxide Films", J. Phys. D. Appl. Phys. 20, (1987), pp. 1063-1066.

Office Action of European Patent Application No. 08779800.5 mailed May 4, 2010.

Office Action of related U.S. Appl. No. 11/772,084 mailed Jul. 8, 2010.

Oct. 8, 2010 Reply to Jul. 8, 2010 Office Action of related U.S. Appl. No. 11/772,084.

Office Action of related U.S. Appl. No. 11/772,084 mailed Jul. 8, 2010.

Sep. 3, 2010 Reply to counterpart Office Action of European Patent Application No. 08779800.5 mailed May 4, 2010.

* cited by examiner

MEMORY CELL THAT EMPLOYS A SELECTIVELY DEPOSITED REVERSIBLE RESISTANCE-SWITCHING ELEMENT AND METHODS OF FORMING THE SAME

CROSS REFERENCE TO RELATED APPLICATIONS

The present application is related to the following patent applications, each of which is hereby incorporated by reference herein in its entirety for all purposes:

U.S. patent application Ser. No. 11/772,081, filed on even date herewith and titled "METHOD TO FORM A REWRITEABLE MEMORY CELL COMPRISING A DIODE AND A RESISTIVITY-SWITCHING GROWN OXIDE".

U.S. patent application Ser. No. 11/772,082, filed on even date herewith and titled "MEMORY CELL THAT EMPLOYS A SELECTIVELY GROWN REVERSIBLE RESISTANCE-SWITCHING ELEMENT AND METHODS OF FORMING THE SAME".

U.S. patent application Ser. No. 11/772,088, filed on even date herewith and titled "MEMORY CELL THAT EMPLOYS A SELECTIVELY GROWN REVERSIBLE RESISTANCE-SWITCHING ELEMENT AND METHODS OF FORMING THE SAME".

FIELD OF THE INVENTION

The present invention relates to non-volatile memories and more particularly to a memory cell that employs a selectively deposited reversible resistance-switching element and methods of forming the same.

BACKGROUND OF THE INVENTION

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 Application"), which is hereby incorporated by reference herein in its entirety, describes a rewriteable non-volatile memory cell that includes a diode coupled in series with a reversible resistivity-switching material such as a metal oxide or metal nitride.

However, fabricating memory devices from rewriteable resistivity-switching materials is difficult; and improved methods of forming memory devices that employ resistivity-switching materials are desirable.

SUMMARY OF THE INVENTION

In a first aspect of the invention, a method of forming a memory cell is provided that includes (1) forming a steering element above a substrate; and (2) forming a reversible resistance-switching element coupled to the steering element using a selective deposition process.

In a second aspect of the invention, a method of forming a memory cell is provided that includes (1) forming a first conductor above a substrate; (2) forming a diode above the first conductor; (3) forming a reversible resistance-switching element above the first conductor using a selective deposition process; and (4) forming a second conductor above the diode and the reversible resistance-switching element.

In a third aspect of the invention, a method of forming a memory cell is provided that includes (1) forming a first conductor above a substrate; (2) forming a vertical polycrystalline diode above the first conductor; (3) selectively forming a reversible resistance-switching element including a nickel oxide layer above the vertical polycrystalline diode; and (4) forming a second conductor above the vertical polycrystalline diode.

In a fourth aspect of the invention, a method of forming a memory cell is provided that includes (1) forming a thin film transistor having a source region and a drain region; (2) forming a first conductor coupled to the source region or the drain region of the transistor; (3) selectively forming a reversible resistance-switching element including a nickel oxide layer above the first conductor; and (4) forming a second conductor above the reversible resistance-switching element.

In a fifth aspect of the invention, a memory cell is provided that includes (1) a steering element; and (2) a reversible resistance-switching element coupled to the steering element and formed using a selective deposition process.

In a sixth aspect of the invention, a memory cell is provided that includes (1) a first conductor; (2) a second conductor formed above the first conductor; (3) a diode formed between the first and second conductors; and (4) a reversible resistance-switching element formed between the first and second conductors using a selective deposition process.

In a seventh aspect of the invention, a memory cell is provided that includes (1) a first conductor; (2) a vertical polycrystalline diode formed above the first conductor; (3) a reversible resistance-switching element including a nickel oxide layer selectively formed above the vertical polycrystalline diode; and (4) a second conductor formed above the vertical polycrystalline diode.

In an eighth aspect of the invention, a memory cell is provided that includes (1) a thin film transistor having a source region and a drain region; (2) a first conductor coupled to the source region or the drain region; (3) a reversible resistance-switching element including a nickel oxide layer selectively formed above the first conductor; and (4) a second conductor formed above the reversible resistance-switching element.

In a ninth aspect of the invention, a plurality of non-volatile memory cells are provided that include (1) a first plurality of substantially parallel, substantially coplanar conductors extending in a first direction; (2) a plurality of diodes; (3) a plurality of reversible resistance-switching elements; and (4) a second plurality of substantially parallel, substantially coplanar conductors extending in a second direction different from the first direction. In each memory cell, one of the diodes and one of the reversible resistance-switching elements are arranged in series, disposed between one of the first conductors and one of the second conductors. Further, each reversible resistance-switching element is formed using a selective deposition process.

In a tenth aspect of the invention, a monolithic three dimensional memory array is provided that includes a first memory level formed above a substrate. The first memory level includes a plurality of memory cells each having (1) a steering element; and (2) a reversible resistance-switching element coupled to the steering element and formed using a selective deposition process. The monolithic three dimensional memory array also includes at least a second memory level monolithically formed above the first memory level. Numerous other aspects are provided in accordance with these and other embodiments of the invention.

Other features and aspects of the present invention will become more fully apparent from the following detailed description, the appended claims and the accompanying drawings.

DETAILED DESCRIPTION

As stated above, fabricating memory devices from rewriteable resistivity-switching materials is difficult. For example, many rewriteable resistivity-switching materials are difficult to etch chemically, increasing fabrication costs and complexity associated with their use in integrated circuits.

In accordance with the present invention, difficult-to-etch-chemically rewriteable resistivity-switching materials may be used within a memory cell without being etched. For example, in at least one embodiment, a memory cell is provided that includes a reversible resistivity-switching material formed using a selective deposition process so that the reversible resistivity-switching material may be used within the memory cell without being etched.

In one or more exemplary embodiments, a reversible resistance-switching element may be formed using nickel oxide as a reversible resistivity-switching material. Nickel oxide films have been shown to be suitable for use in memory cells, as described, for example, in the '939 Application, previously incorporated.

Nickel-containing films such as Ni, $Ni_xP_y$, NiO, $NiO_x$, $NiO_xP_y$, etc., are difficult to etch chemically. In at least one embodiment, through use of a selective deposition process, a nickel oxide layer may be used in a reversible resistance-switching element of a memory cell without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In some embodiments, nickel oxide may be selectively deposited while in other embodiments, nickel may be selectively deposited and then oxidized to form nickel oxide. In either case, the need for etching of nickel and/or nickel oxide layers may be eliminated and memory cell fabrication significantly simplified.

Other materials may be selectively deposited, and then annealed and/or oxidized if necessary, in accordance with the present invention to form reversible or one-time-programmable resistivity-switching materials for use in memory cells. For example, a layer of Nb, Ta, V, Al, Ti, Co, cobalt-nickel alloy, etc., may be selectively deposited, such as by electroplating, and oxidized to form a reversible resistivity-switching material.

Exemplary Inventive Memory Cell

Figure 1:
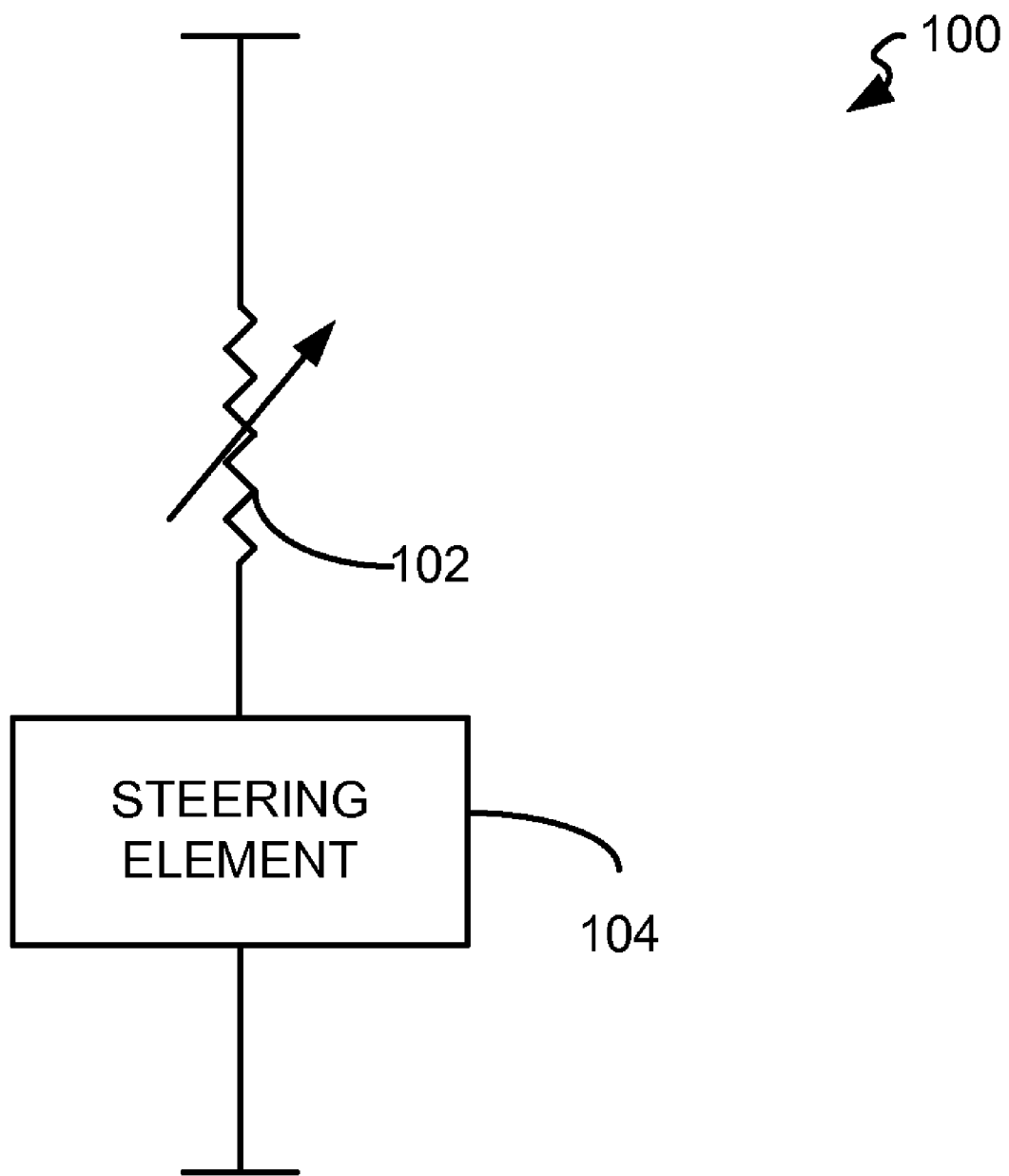
FIG. 1 is a schematic illustration of an exemplary memory cell provided in accordance with the present invention.

FIG. 1 is a schematic illustration of an exemplary memory cell 100 provided in accordance with the present invention. The memory cell 100 includes a reversible resistance-switching element 102 coupled to a steering element 104.

The reversible resistance-switching element 102 includes a reversible resistivity-switching material (not separately shown) having a resistivity that may be reversibly switched between two or more states. For example, the reversible resistivity-switching material of the element 102 may be in an initial, low-resistivity state upon fabrication that is switchable to a high-resistivity state upon application of a first voltage and/or current. Application of a second voltage and/or current may return the reversible resistivity-switching material to a low-resistivity state. Alternatively, the reversible resistance-switching element 102 may be in an initial, high-resistance state upon fabrication that is reversibly switchable to a low-resistance state upon application of the appropriate voltage(s) and/or current(s). When used in a memory cell, one resistance state may represent a binary "0" while another resistance state may represent a binary "1", although more than two data/resistance states may be used. Numerous reversible resistivity-switching materials and operation of memory cells employing reversible resistance-switching elements are described, for example, the '939 Application, previously incorporated.

In at least one embodiment of the invention, the reversible resistance-switching element 102 is formed using a selective deposition process. As will be described further below, use of a selective deposition process allows a reversible resistivity-switching material to be provided within the reversible resistance-switching element 102 without the reversible resistivity-switching material having to be etched. Fabrication of the reversible resistance-switching element 102 thereby is simplified.

The steering element 104 may include a thin film transistor, a diode, or another suitable steering element that exhibits non-ohmic conduction by selectively limiting the voltage across and/or the current flow through the reversible resistance-switching element 102. In this manner, the memory cell 100 may be used as part of a two or three dimensional memory array and data may be written to and/or read from the memory cell 100 without affecting the state of other memory cells in the array.

Exemplary embodiments of the memory cell 100, the reversible resistance-switching element 102 and the steering element 104 are described below with reference to FIGS. 2A-6.

First Exemplary Embodiment of a Memory Cell

Figure 2A:
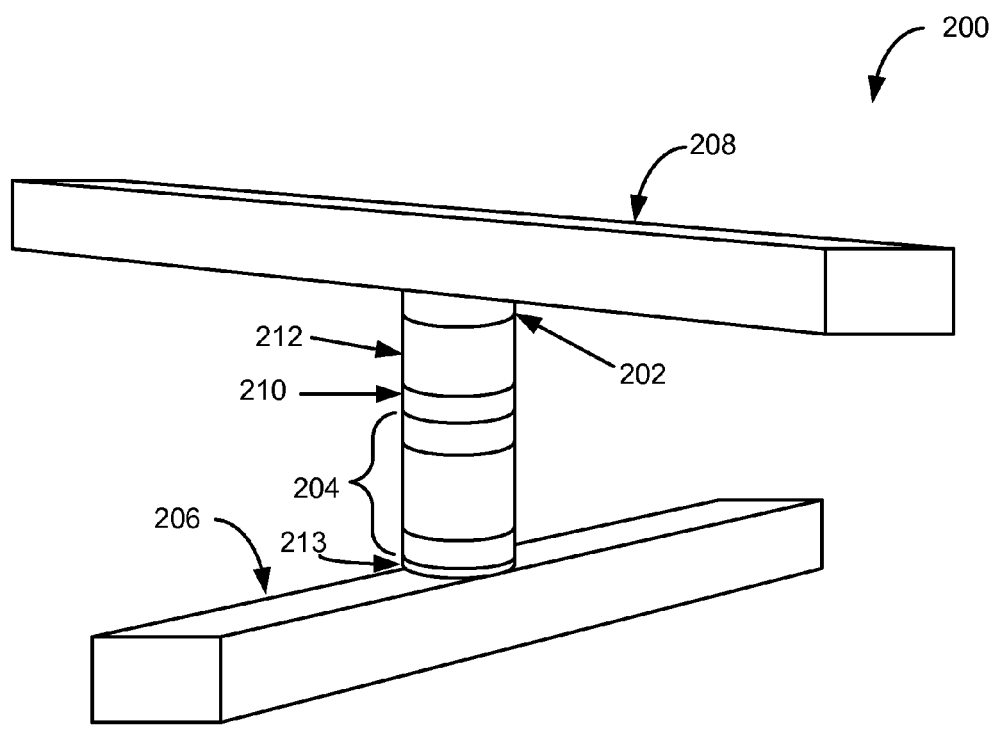
FIG. 2A is a simplified perspective view of a first embodiment of a memory cell provided in accordance with the present invention.

FIG. 2A is a simplified perspective view of a first embodiment of a memory cell 200 provided in accordance with the present invention. With reference to FIG. 2A, the memory cell 200 includes a reversible resistance-switching element 202 coupled in series with a diode 204 between a first conductor 206 and a second conductor 208. In some embodiments, a barrier layer 210 and/or a conductive layer 212 may be formed between the reversible resistance-switching element 202 and the diode 204. For example, the barrier layer 210 may include titanium nitride, tantalum nitride, tungsten nitride, etc., and the conductive layer 212 may include tungsten or another suitable metal layer. As will be described further below, the barrier layer 210 and/or conductive layer 212 may serve as a hard mask during formation of the diode 204. Such a hard mask is described, for example, in U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 Application") which is hereby incorporated by reference herein in its entirety. An additional barrier layer 213, such as titanium nitride, tantalum nitride, tungsten nitride, etc., also may be formed between the diode 204 and the first conductor 206.

As will be described further below, the reversible resistance-switching element 202 is selectively formed so as to simplify fabrication of the memory cell 200. In at least one embodiment, the reversible resistance-switching element 202 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO—, $NiO_x$— or $NiO_xP_y$-containing layer may be selectively deposited above the diode 204 using a selective deposition process and then annealed and/or oxidized (if necessary). These and other embodiments are described further below with reference to FIG. 3. While the reversible resistance-switching element 202 is shown as being positioned above the diode 204 in FIG. 2A, it will be understood that in alternative embodiments, the reversible resistance-switching element 202 may be positioned below the diode 204 (as described below, for example, with reference to FIG. 6). In some embodiments, only a portion, such as one or more filaments, of the reversible resistance-switching element 202 may switch and/or be switchable.

The diode 204 may include any suitable diode such as a vertical polycrystalline p-n or p-i-n diode, whether upward pointing with an n-region above a p-region of the diode or downward pointing with a p-region above an n-region of the diode. Exemplary embodiments of the diode 204 are described below with reference to FIG. 3.

The first and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, the first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first and/or second conductors 206 to improve device performance and/or aid in device fabrication.

As stated, other materials may be used to form the reversible resistance-switching element 202. For example, materials such as Nb, Ta, V, Al, Ti, Co, cobalt-nickel alloy, etc., may be similarly selectively deposited over diode 204 (such as over the barrier layer 210 and/or over the conductive layer 212 as shown in FIG. 2A) and, if necessary, oxidized and/or annealed to form the reversible resistance-switching element 202.

Figure 2B:
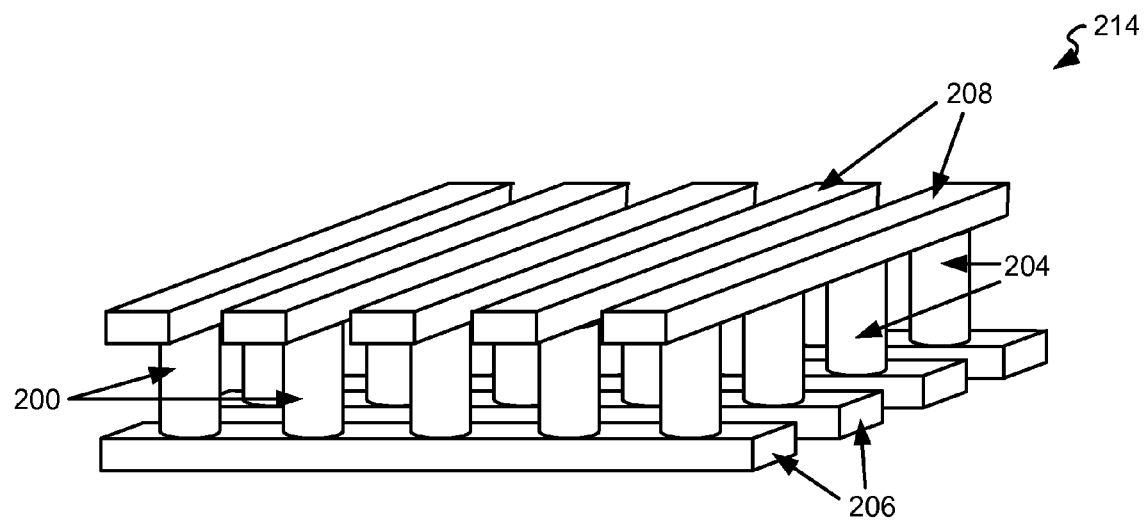
FIG. 2B is a simplified perspective view of a portion of a first memory level formed from a plurality of the memory cells of FIG. 2A.
Figure 2C:
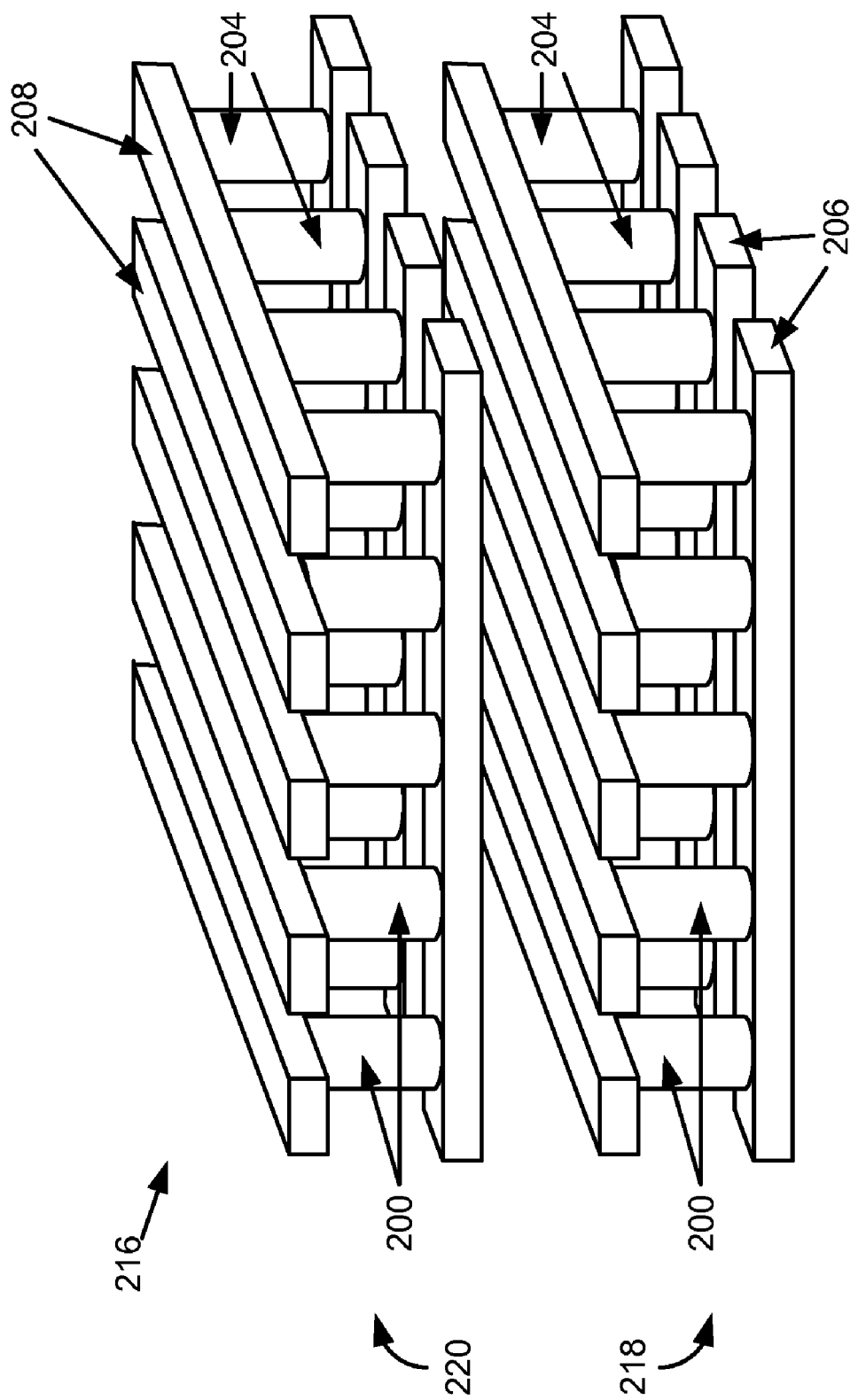
FIG. 2C is a simplified perspective view of a portion of a first exemplary three dimensional memory array provided in accordance with the present invention.

FIG. 2B is a simplified perspective view of a portion of a first memory level 214 formed from a plurality of the memory cells 200 of FIG. 2A. For simplicity, the reversible resistance-switching element 202, the diode 204, the barrier layers 210 and 213 and the conductive layer 212 are not separately shown. The memory array 214 is a "cross-point" array including a plurality of bit lines (second conductors 208) and word lines (first conductors 206) to which multiple memory cells are coupled (as shown). Other memory array configurations may be used, as may multiple levels of memory. For example, FIG. 2C is a simplified perspective view of a portion of a monolithic three dimensional array 216 that includes a first memory level 218 positioned below a second memory level 220. In the embodiment of FIG. 2C, each memory level 218, 220 includes a plurality of memory cells 200 in a cross-point array. It will be understood that additional layers (e.g., an interlevel dielectric) may be present between the first and second memory levels 218 and 220, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diode are employed, simplifying diode fabrication.

Figure 2D:
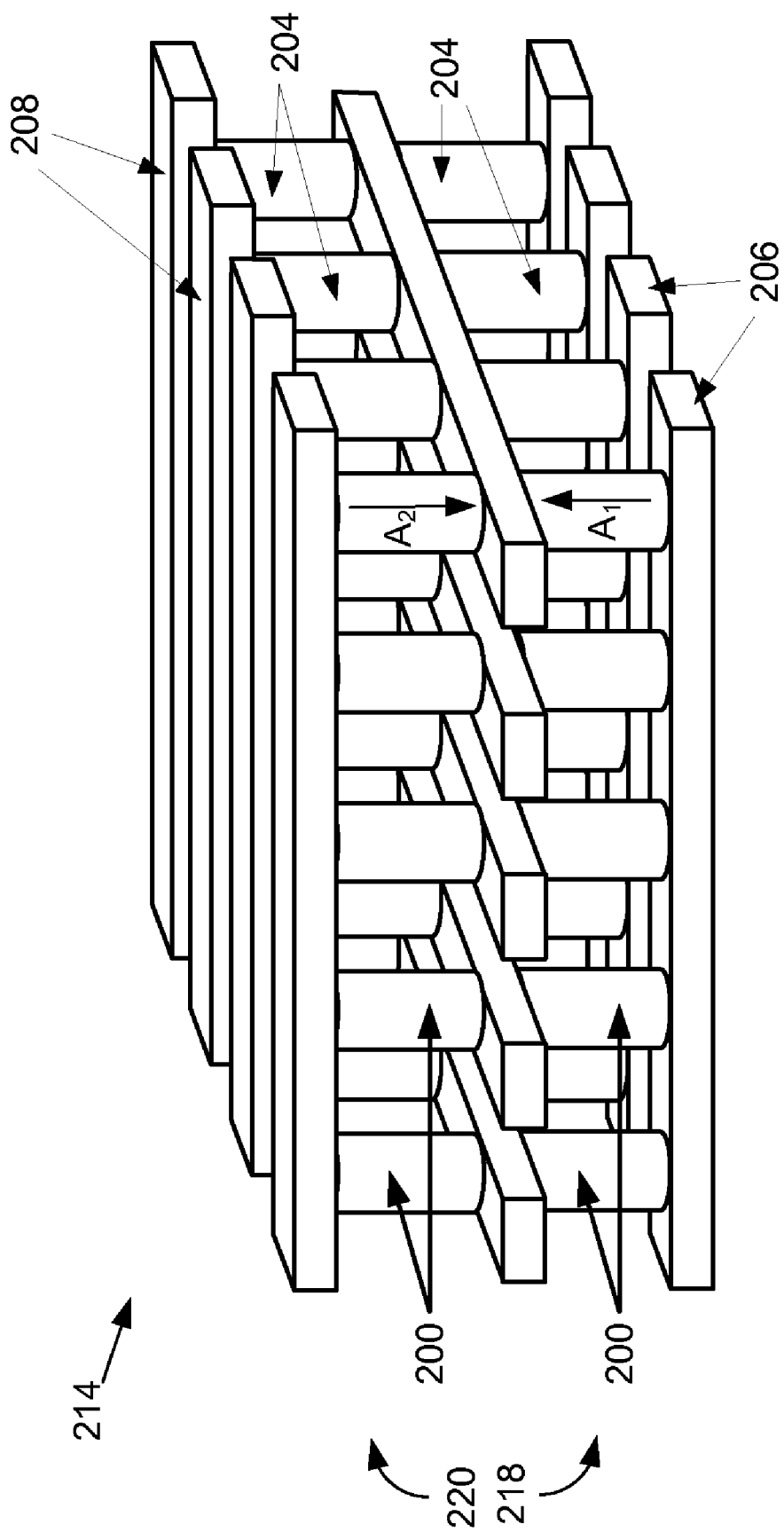
FIG. 2D is a simplified perspective view of a portion of a second exemplary three dimensional memory array provided in accordance with the present invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692, 151, filed Mar. 27, 2007 and titled "LARGE ARRAY OF UPWARD POINTING P-I-N DIODES HAVING LARGE AND UNIFORM CURRENT" (hereinafter "the '151 Application"), which is hereby incorporated by reference herein in its entirety for all purposes. For example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 3:
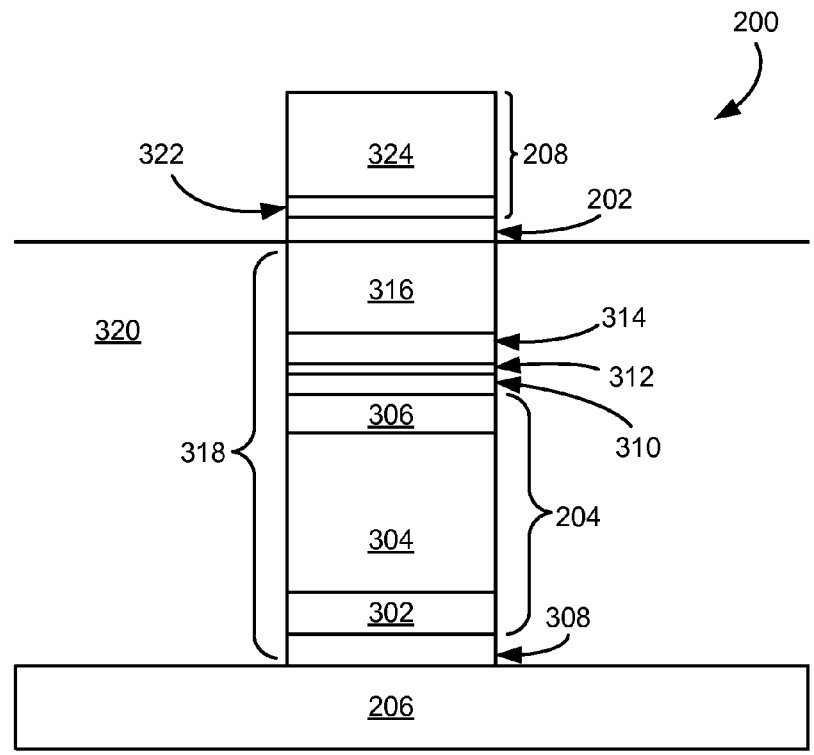
FIG. 3 is a cross-sectional view of an exemplary embodiment of the memory cell of FIG. 2A.

FIG. 3 is a cross-sectional view of an exemplary embodiment of the memory cell 200 of FIG. 2A. With reference to FIG. 3, the memory cell 200 includes the reversible resistance-switching element 202, the diode 204 and the first and second conductors 206, 208.

As stated, the diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, the diode 204 may be formed from a polycrystalline semiconductor material such as polysilicon, a polycrystalline silicon-germanium alloy, polygermanium or any other suitable material. For example, the diode 204 may include a heavily doped n+ polysilicon region 302, a lightly doped or an intrinsic (unintentionally doped) polysilicon region 304 above the n+ polysilicon region 302 and a heavily doped, p+ polysilicon region 306 above the intrinsic region 304. In some embodiments, a thin (e.g., a few hundred angstroms or less) germanium and/or silicon-germanium alloy layer (not shown), with about 10 at % or more of germanium when using a silicon-germanium alloy layer, may be formed on the n+ polysilicon region 302 to prevent and/or reduce dopant migration from the n+ polysilicon region 302 into the intrinsic region 304, as described, for example, in U.S. patent application Ser. No. 11/298,331, filed Dec. 9, 2005 and titled "DEPOSITED SEMICONDUCTOR STRUCTURE TO MINIMIZE N-TYPE DOPANT DIFFUSION AND METHOD OF MAKING" (hereinafter "the '331 Application"), which is hereby incorporated by reference herein in its entirety for all purposes. It will be understood that the locations of the n+ and p+ regions may be reversed. A barrier layer 308, such as titanium nitride, tantalum nitride, tungsten nitride, etc., may be formed between the first conductor 206 and the n+ region 302 (e.g., to prevent and/or reduce migration of metal atoms into the polysilicon regions).

When the diode 204 is fabricated from deposited silicon (e.g., amorphous or polycrystalline), a silicide layer 310 may be formed on the diode 204 to place the deposited silicon in a low resistivity state, as fabricated. Such a low resistivity state allows for easier programming of the memory cell 200 as a large voltage is not required to switch the deposited silicon to a low resistivity state. For example, a silicide-forming metal layer 312 such as titanium or cobalt may be deposited on the p+ polysilicon region 306. During a subsequent anneal step (described below) employed to crystallize the deposited silicon that forms the diode 204, the silicide-forming metal layer 312 and the deposited silicon of the diode 204 interact to form the silicide layer 310, consuming all or a portion of the silicide-forming metal layer 312.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer 310 enhances the crystalline structure of the silicon diode 204 during annealing). Lower resistivity silicon thereby is provided. Similar results may be achieved for silicon-germanium alloy and/or germanium diodes.

In the embodiment of FIG. 3, the reversible resistance-switching element 202 is formed by a selective deposition process. In some embodiments, the reversible resistance-switching element 202 may be formed over the conductive silicide-forming metal layer 312 (or on a conductive barrier layer formed over the silicide-forming metal layer 312). (Such layers may be patterned during formation of the diode 204 as described below with reference to FIGS. 4A-4D.) However, in other embodiments, a metal hard mask may be formed over the silicide-forming metal layer 312 prior to formation of the resistance-switching element 202. For example, a barrier layer 314 and/or a conductive layer 316 may be formed over the silicide-forming metal layer 312. The barrier layer 314 may include titanium nitride, tantalum nitride, tungsten nitride, etc., and the conductive layer 316 may include tungsten or another suitable metal layer. As will be described further below, the barrier layer 314 and/or conductive layer 316 may serve as a hard mask during formation of the diode 204 and may mitigate any overetching that may occur during formation of the top conductor 208 (as described in the '936 Application, previously incorporated). For example, the barrier layer 314 and conductive layer 316 may be patterned and etched, and then serve as a mask during etching of the diode 204. Etching of the conductive layer 316, barrier layer 314, silicide-forming metal layer 312, diode 204 (p+ polysilicon layer 306, intrinsic layer 304, n+ polysilicon layer 302) and barrier layer 308 creates a pillar structure 318. Dielectric material 320 is deposited on top of and around the pillar structure 318 so as to isolate the pillar structure 318 from other similar pillar structures of other memory cells (not shown) fabricated on a memory level that includes the memory cell 200. A CMP or dielectric etchback step then is performed to planarize the dielectric material 320 and remove the dielectric material from the top of the conductive layer 316.

After planarization of the dielectric material 320, the reversible resistance-switching element 202 may be formed over the patterned and etched conductive layer 316 by a selective deposition process. For example, a nickel oxide layer may be selectively formed over the patterned and etched conductive layer 316 by (1) selectively depositing nickel oxide, such as NiO, $NiO_x$, $NiO_xP_y$ and, if needed, annealing and/or oxidizing the nickel oxide; and/or (2) selectively depositing nickel and then oxidizing the nickel. In either case, because the nickel oxide only deposits on the patterned and etched top surface of the conductive layer 316, the need for etching of nickel and/or nickel oxide layers may be eliminated and memory cell fabrication significantly simplified. Further, any desired thickness of nickel oxide may be formed. In some embodiments, a nickel oxide layer thickness of about 1000 angstroms or less, and more preferably about 500 angstroms or less, is employed for the reversible resistance-switching element 202 (although other thickness ranges may be used).

In one embodiment, after formation, patterning and etching of the conductive layer 316, an electroless deposition process is employed to selectively deposit nickel or nickel oxide on the conductive layer 316. For example, an aqueous solution may be employed to selectively form nickel or nickel oxide on the conductive layer 316 by submerging the conductive layer 316 in the aqueous solution. The aqueous solution may include, for example, one or more dissolved salts/precursors, complexing agents and/or buffers for regulating pH of the solution. In some embodiments, the aqueous solution may include nickel salts and/or nickel salt hydroxides, such as nickel sulfates, nickel sulfites, nickel phosphates, nickel phosphides, nickel hydroxides, ammonia phosphates, or mixtures of the same. Further exemplary components may include $NiSO_4$, $NaH_2PO_2$, sodium citrate, $(NH_4)_2SO_4$, or the like. It will be understood that either nickel or nickel oxide (or both) may be deposited on the conductive layer 316 depending on the exact components used to form the aqueous solution and/or other process conditions.

Exemplary process conditions include submerging the conductive layer 316 in an aqueous nickel-containing solution for about 1 second to about 5 minutes while the aqueous solution is maintained at a temperature of between about 20 to 85° C. Additional exemplary aqueous solutions and/or process conditions that may be used to selectively form a nickel or nickel oxide layer are described in N. Takano et al., "Mechanism of the Chemical Deposition of Nickel on Silicon Wafers in Aqueous Solution", Journal of Electrochemical Society, 146(4) pp. 1407-1411 (1999), which is hereby incorporated by reference herein in its entirety for all purposes. As stated, deposited nickel or nickel oxide may include Ni, $Ni_xP_y$, NiO, $NiO_x$, $NiO_xP_y$, or other similar materials.

Following formation of nickel or nickel oxide, a thermal oxidation process may be used to either form nickel oxide from selectively deposited nickel or to improve the morphology and/or electrical characteristics of selectively deposited nickel oxide. Exemplary oxidation conditions include rapid thermal oxidation in an oxygen environment such as $O_2$ for about 20 seconds to 10 minutes at a temperature of about 400 to 800° C. Other oxidation or annealing processes, oxygen species, times and/or temperatures may be used.

Another suitable selective deposition process that may be used to form a nickel-containing layer on the patterned and etched conductive layer 316 includes conventional nickel electroplating. Any suitable electroplating process may be employed to selectively deposit nickel on the conductive layer 316. Thereafter, the electroplated nickel may be oxidized to form nickel oxide as described above.

As stated, other materials may be used to form the reversible resistance-switching element 202. For example, materials such as Nb, Ta, V, Al, Ti, Co, cobalt-nickel alloy, etc., may be similarly selectively deposited over diode 204 (such as over the barrier layer 210 and/or over the conductive layer 212 as shown in FIG. 2A) and annealed and/or oxidized, if necessary.

Following formation of the reversible resistance-switching element 202, the top conductor 208 is formed. In some embodiments, one or more barrier layers and/or adhesion layers 322 may be formed over the reversible resistance-switching element 202 prior to deposition of a conductive layer 324. The conductive layer 324 and barrier layer 322 may be patterned and/or etched together to form the top conductor 208. In some embodiments, the top conductor 208 may be formed using a damascene process as described below with reference to FIGS. 4A-4D.

Following formation of the top conductor 208, the memory cell 200 may be annealed to crystallize the deposited semiconductor material of the diode 204 (and/or to form the silicide layer 310). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, the silicide layer 310 may serve as a "crystallization template" or "seed" during annealing for underlying deposited semiconductor material that forms the diode 204. Lower resistivity diode material thereby is provided.

An exemplary process for fabricating a memory cell in accordance with the present invention is described below with reference to FIGS. 4A-D.

Exemplary Fabrication Process for a Memory Cell

FIGS. 4A-4D illustrate cross sectional views of a portion of a substrate 400 during fabrication of a first memory level in accordance with the present invention. As will be described below, the first memory level includes a plurality of memory cells that each include a reversible resistance-switching element formed using a selective deposition process. Additional memory levels may be fabricated above the first memory level (as described previously with reference to FIGS. 2C-2D).

Figure 4A:
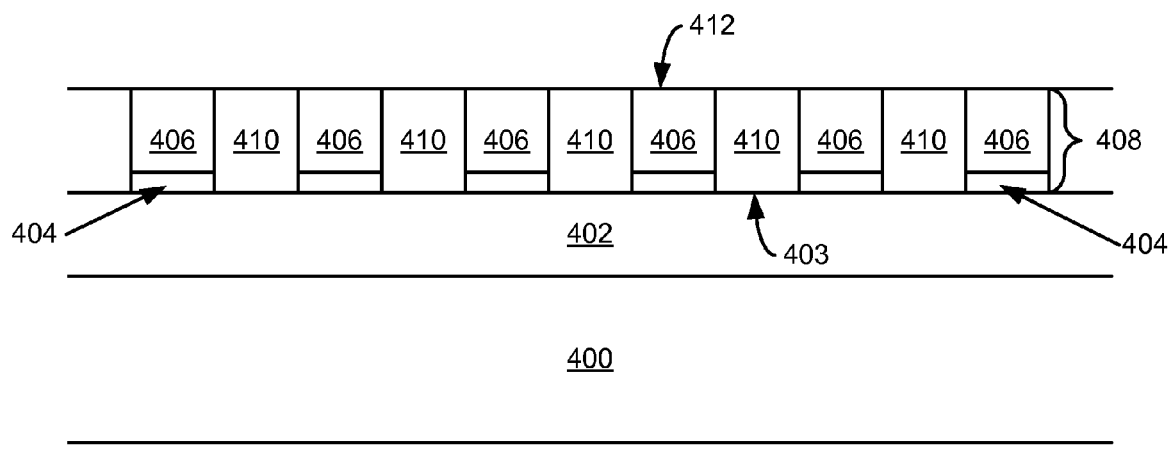
FIGS. 4A-4D illustrate cross sectional views of a portion of a substrate during fabrication of a single memory level in accordance with the present invention.

With reference to FIG. 4A, the substrate 400 is shown as having already undergone several processing steps. The substrate 400 may be any suitable substrate such as a silicon, germanium, silicon-germanium, undoped, doped, bulk, silicon-on-insulator (SOI) or other substrate with or without additional circuitry. For example, the substrate 400 may include one or more n-well or p-well regions (not shown).

Isolation layer 402 is formed above the substrate 400. In some embodiments, the isolation layer 402 may be a layer of silicon dioxide, silicon nitride, silicon oxynitride or any other suitable insulating layer.

Following formation of the isolation layer 402, an adhesion layer 404 is formed over the isolation layer 402 (e.g., by physical vapor deposition or another method). For example, the adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, the adhesion layer 404 may be optional.

After formation of the adhesion layer 404, a conductive layer 406 is deposited over the adhesion layer 404. The conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition (CVD), physical vapor deposition (PVD), etc.). In at least one embodiment, the conductive layer 406 may comprise about 200 to about 2500 angstroms of tungsten. Other conductive layer materials and/or thicknesses may be used.

Following formation of the conductive layer 406, the adhesion layer 404 and the conductive layer 406 are patterned and etched. For example, the adhesion layer 404 and the conductive layer 406 may be patterned and etched using conventional lithography techniques, with a soft or hard mask, and wet or dry etch processing. In at least one embodiment, the adhesion layer 404 and conductive layer 406 are patterned and etched so as to form substantially parallel, substantially co-planar conductors 408 (as shown in FIG. 4A). Exemplary widths for the conductors 408 and/or spacings between the conductors 408 range from about 200 to about 2500 angstroms, although other conductor widths and/or spacings may be used.

After the conductors 408 have been formed, a dielectric layer 410 is formed over the substrate 400 so as to fill the voids between the conductors 408. For example, approximately 3000-7000 angstroms of silicon dioxide may be deposited on the substrate 400 and planarized using chemical mechanical polishing or an etchback process to form a planar surface 412. The planar surface 412 includes exposed top surfaces of the conductors 408 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, the conductors 408 may be formed using a damascene process in which the dielectric layer 410 is formed and patterned to create openings or voids for the conductors 408. The openings or voids then may be filled with the adhesion layer 404 and the conductive layer 406 (and/or a conductive seed, conductive fill and/or barrier layer if needed). The adhesion layer 404 and conductive layer 406 then may be planarized to form the planar surface 412. In such an embodiment, the adhesion layer 404 will line the bottom and sidewalls of each opening or void.

Figure 4B:
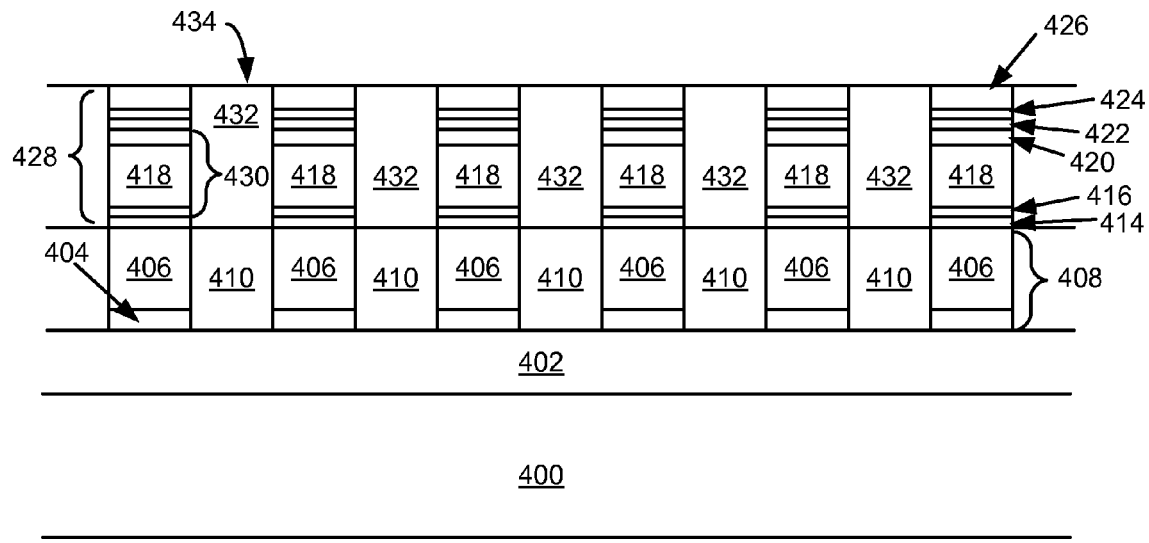
Figure 4C:
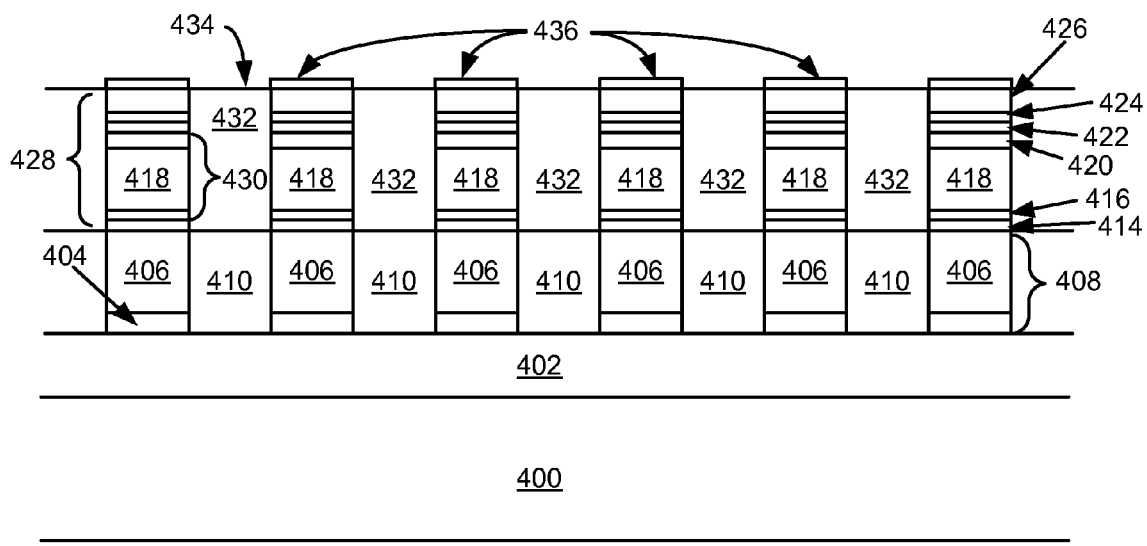

Following planarization, the diode structures of each memory cell are formed. With reference to FIG. 4B, a barrier layer 414 is formed over the planarized top surface 412 of the substrate 400. The barrier layer 414 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of the barrier layer 414, deposition of the semiconductor material used to form the diode of each memory cell begins (e.g., diode 204 in FIGS. 2A-3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of the barrier layer 414, a heavily doped n+ silicon layer 416 is deposited on the barrier layer 414. In some embodiments, the n+ silicon layer 416 is in an amorphous state as deposited. In other embodiments, the n+ silicon layer 416 is in a polycrystalline state as deposited. CVD or another suitable process may be employed to deposit the n+ silicon layer 416. In at least one embodiment, the n+ silicon layer 416 may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. The n+ silicon layer 416 may be doped in situ, for example, by flowing a donor gas during deposition. Other doping methods may be used (e.g., implantation).

After deposition of the n+ silicon layer 416, a lightly doped, intrinsic and/or unintentionally doped silicon layer 418 is formed over the n+ silicon layer 416. In some embodiments, the intrinsic silicon layer 418 is in an amorphous state as deposited. In other embodiments, the intrinsic silicon layer 418 is in a polycrystalline state as deposited. CVD or another suitable deposition method may be employed to deposit the intrinsic silicon layer 418. In at least one embodiment, the intrinsic silicon layer 418 may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on the n+ silicon layer 416 prior to deposition of the intrinsic silicon layer 418 to prevent and/or reduce dopant migration from the n+ silicon layer 416 into the intrinsic silicon layer 418 (as described in the '331 Application, previously incorporated).

Heavily doped, p-type silicon is either deposited and doped by ion implantation or is doped in situ during deposition to form a p+ silicon layer 420. For example, a blanket p+ implant may be employed to implant boron a predetermined depth within the intrinsic silicon layer 418. Exemplary implantable molecular ions include $BF_2$, $BF_3$, B and the like. In some embodiments, an implant dose of about $1\text{-}5\times10^{15}$ ions/cm$^2$ may be employed. Other implant species and/or doses may be used. Further, in some embodiments, a diffusion process may be employed. In at least one embodiment, the resultant p+ silicon layer 420 has a thickness of about 100-700 angstroms, although other p+ silicon layer sizes may be used.

Following formation of the p+ silicon layer 420, a silicide-forming metal layer 422 is deposited over the p+ silicon layer 420. Exemplary silicide-forming metals include sputter or otherwise deposited titanium or cobalt. In some embodiments, the silicide-forming metal layer 422 has a thickness of about 10 to about 200 angstroms, preferably about 20 to about 50 angstroms and more preferably about 20 angstroms. Other silicide-forming metal layer materials and/or thicknesses may be used.

A barrier layer 424 is deposited over the silicide-forming metal layer 422. The barrier layer 424 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Following formation of the barrier layer 424, a conductive layer 426 is formed over the barrier layer 424. The conductive layer 426 may be about 50 to about 1000 angstroms, and preferably about 500 angstroms of conductive material such as tungsten or another suitable metal.

The barrier layer 414, silicon regions 416, 418, and 420, silicide-forming metal layer 422, barrier layer 424 and conductive layer 426 are then patterned and etched into pillars 428. For example, initially, the conductive layer 426 and barrier layer 424 are etched. The etch continues, etching silicide-forming metal layer 422, silicon regions 420, 418, and 416 and barrier layer 414. Conductive layer 426 and barrier layer 414 serve as a hard mask during the silicon etch. A hard mask is an etched layer which serves to pattern the etch of an underlying layer; if all of the photoresist present on the conductive layer 426 has been consumed, the hard mask can provide the pattern in its stead. In this manner, the pillars 428 are formed in a single photolithographic step. Conventional lithography techniques, and wet or dry etch processing may be employed to form the pillars 428. Each pillar 428 includes a p-i-n, downward-pointing diode 430. Upward-pointing p-i-n diodes may be similarly formed.

After the pillars 428 have been formed, a dielectric layer 432 is deposited over the pillars 428 to fill the voids between the pillars 428. For example, approximately 200-7000 angstroms of silicon dioxide may be deposited and planarized using chemical mechanical polishing or an etchback process to form a planar surface 434. The planar surface 434 includes exposed top surfaces of the pillars 428 separated by dielectric material 432 (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

After formation of the planar surface 434, a reversible resistance-switching element 436 (FIG. 4C) is selectively formed over each pillar 428. For example, a nickel oxide layer may be selectively formed over each conductive pillar 428 by selectively depositing (1) nickel oxide; and/or (2) selectively depositing nickel and then oxidizing the nickel. In either case, the need for etching of nickel and/or nickel oxide layers may be eliminated and memory cell fabrication significantly simplified. As described previously, any suitable method for selectively depositing nickel or a nickel oxide may be used such as electroless deposition, electroplating or the like. In at least one embodiment, the reversible resistance-switching element 436 formed over each conductive pillar 428 includes a nickel oxide layer having a thickness of about 1000 angstroms or less, and more preferably a thickness of about 500 angstroms or less. Other nickel oxide thicknesses may be employed. The nickel oxide layer may include, for example, NiO, $NiO_x$, and $NiO_xP_y$, or other similar materials. Other materials such as Nb, Ta, V, Al, Ti, Co, cobalt-nickel alloy, etc., may be similarly selectively deposited, oxidized and/or annealed to form a selectively deposited, reversible resistance-switching element over each pillar 428.

Figure 4D:
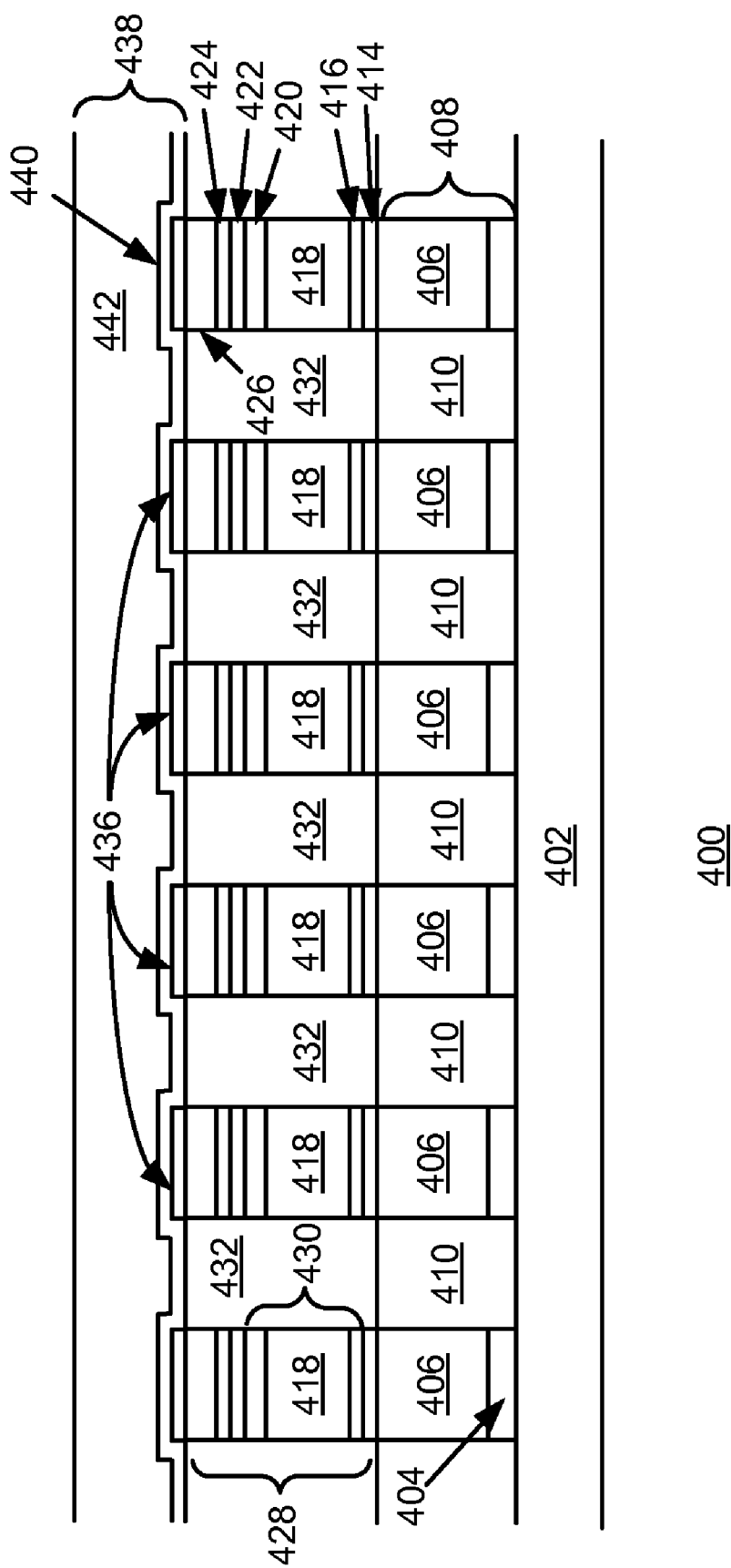

With reference to FIG. 4D, following formation of the reversible resistance-switching elements 436, a second set of conductors 438 maybe formed above the pillars 428 in a manner similar to the formation of the bottom set of conductors 408. For example, as shown in FIG. 4D, in some embodiments, one or more barrier layers and/or adhesion layers 440 may be deposited over the reversible resistance-switching elements 436 prior to deposition of a conductive layer 442 used to form the upper, second set of conductors 438.

The conductive layer 442 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 440 may include titanium nitride or another suitable layer such as tantalum nitride, tungsten nitride, combinations of one or more layers, or any other suitable material(s). The deposited conductive layer 442 and barrier and/or adhesion layer 440, may be patterned and etched to form the second set of conductors 438. In at least one embodiment, the upper conductors 438 are substantially parallel, substantially coplanar conductors that extend in a different direction than the lower conductors 408.

In other embodiments of the invention, the upper conductors 438 may be formed using a damascene process in which a dielectric layer is formed and patterned to create openings or voids for the conductors 438. As described in the '936 Application, the conductive layer 426 and barrier layer 424 may mitigate the affects of overetching of such a dielectric layer during formation of the openings or voids for the upper conductors 438, preventing accidental shorting of the diodes 430.

The openings or voids may be filled with the adhesion layer 440 and the conductive layer 442 (and/or a conductive seed, conductive fill and/or barrier layer if needed). The adhesion layer 440 and conductive layer 442 then may be planarized to form a planar surface.

Following formation of the upper conductors 438, the structure may be annealed to crystallize the deposited semiconductor material of the diodes 430 (and/or to form silicide regions by reaction of the silicide-forming metal layer 422 with p+ region 420). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 422 and p+ region 420 react may serve as "crystallization templates" or "seeds" during annealing for underlying deposited semiconductor material that forms the diodes 430 (e.g., changing any amorphous semiconductor material to polycrystalline semiconductor material and/or improving overall crystalline properties of the diodes 430). Lower resistivity diode material thereby is provided.

First Alternative Exemplary Memory Cell

Figure 5:
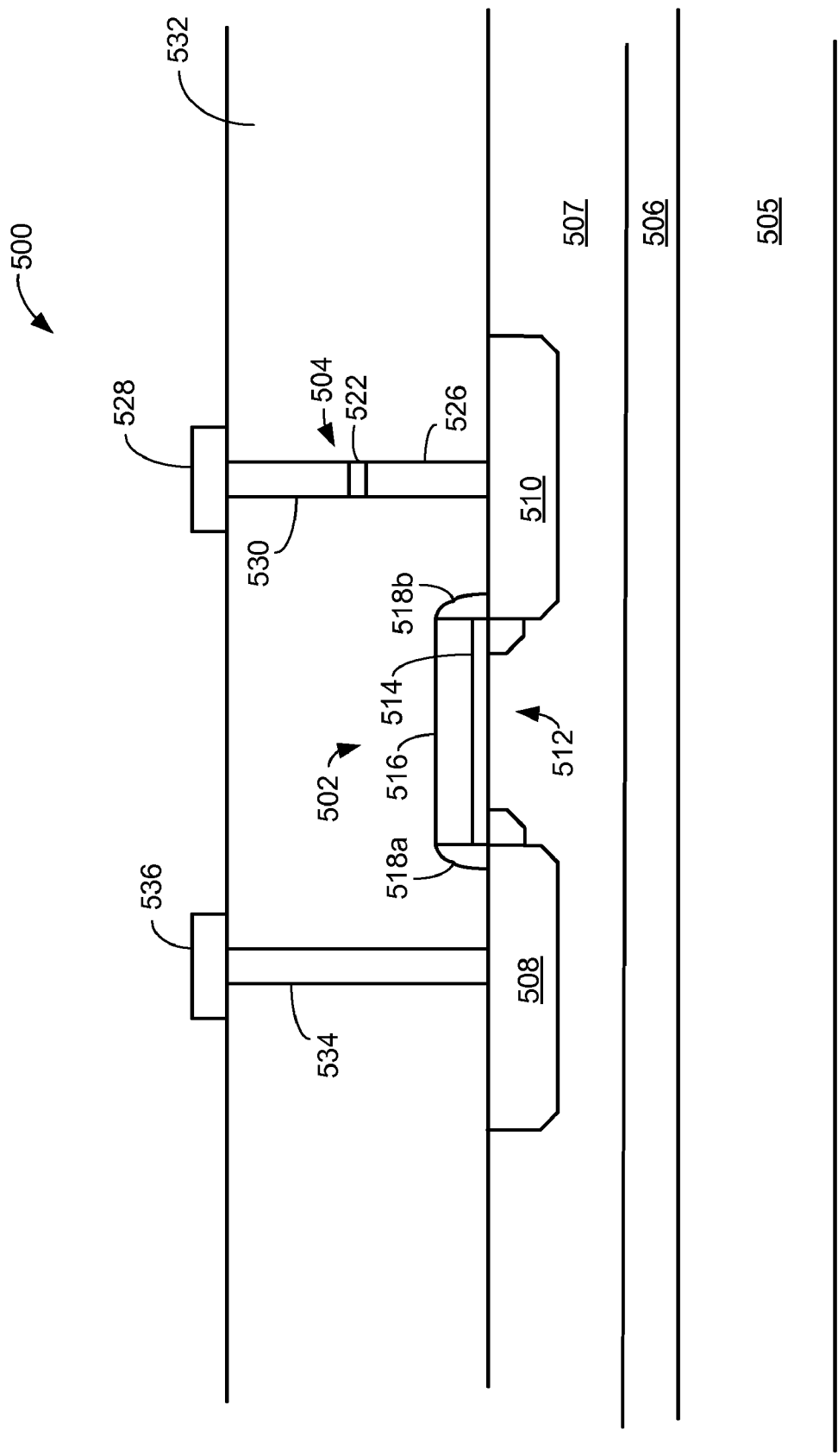
FIG. 5 is a cross sectional view of a first alternative memory cell provided in accordance with the present invention.

FIG. 5 is a cross sectional view of an exemplary memory cell 500 provided in accordance with the present invention. The memory cell 500 includes a thin film transistor (TFT), such as a thin film, metal oxide semiconductor field effect transistor (MOSFET) 502 coupled to a reversible resistance-switching element 504 formed above a substrate 505. For example, the MOSFET 502 may be an n-channel or a p-channel thin film MOSFET formed on any suitable substrate. In the embodiment shown, an insulating region 506 such as silicon dioxide, silicon nitride, oxynitride, etc., is formed above the substrate 505 and a deposited semiconductor region 507 such as deposited silicon, germanium, silicon-germanium, etc., is formed above the insulating region 506. The thin film MOSFET 502 is formed within the deposited semiconductor region 507 and is insulated from the substrate 505 by the insulating region 506.

The MOSFET 502 includes source/drain regions 508, 510 and channel region 512, as well as gate dielectric layer 514, gate electrode 516 and spacers 518a-b. In at least one embodiment, the source/drain regions 508, 510 may be doped p-type and the channel region 512 may be doped n-type, while in other embodiments the source/drain regions 508, 510 may be doped n-type and the channel region 512 may be doped p-type. Any other MOSFET configuration or any suitable fabrication techniques may be employed for the thin film MOSFET 502. In some embodiments, the MOSFET 502 may be electrically isolated by isolation regions (not shown) formed using an STI, LOCOS or other similar process. Alternatively, gate, source and/or drain regions of the MOSFET 502 may be shared with other transistors (not shown) formed on the substrate 505.

The reversible resistance-switching element 504 includes a reversible resistivity-switching material 522 formed over a conductive plug 526. In at least one embodiment, the reversible resistivity-switching material 522 is formed using a selective deposition process as previously described with reference to the embodiments of FIGS. 1-4D. For example, a nickel oxide layer may be selectively formed over the conductive plug 526 by selectively depositing (1) nickel oxide; and/or (2) selectively deposited nickel and then oxidizing the nickel. Exemplary selective deposition processes include electroless deposition, electroplating, or the like. Other materials may be selectively deposited, oxidized and/or annealed in accordance with the present invention to form reversible resistivity-switching materials for use in memory cell 500 (e.g., Nb, Ta, V, Al, Ti, Co, cobalt-nickel alloy, etc.).

As shown in FIG. 5, the reversible resistance-switching element 504 is coupled to the source/drain region 510 of the MOSFET 502 by the first conductive plug 526 and to a first metal level (M1) line 528 by a second conductive plug 530 (which extend through a dielectric layer 532). Likewise, a third conductive plug 534 couples the source/drain region 508 of the MOSFET 502 to an M1 line 536. The conductive plugs and/or lines may be formed from any suitable materials (without or without barriers layers) such as tungsten, another metal, heavily doped semiconductor material, a conductive silicide, a conductive silicide-germanide, a conductive germanide, or the like. Note that when the MOSFET 502 is an n-channel device, the region 508 serves as the drain and the region 510 serves as the source for the MOSFET 502; and when the MOSFET 502 is an p-channel device, the region 508 serves as the source and the region 510 serves as the drain for the MOSFET 502. The dielectric layer 532 may include any suitable dielectric such as silicon dioxide, silicon nitride, silicon oxynitride, low K dielectrics, etc.

In the memory cell 500, the thin film MOSFET 502 operates as a steering element in a manner similar to that of the diodes employed in the memory cells of FIGS. 2A-4D, selectively limiting the voltage applied across and/or the current flow through the reversible resistance-switching element 504.

In at least one embodiment, the reversible resistance-switching element 504 includes a nickel oxide layer having a thickness of about 1000 angstroms or less, and more preferably a thickness of about 500 angstroms or less. Other nickel oxide thicknesses may be employed.

Second Alternative Memory Cell

Figure 6:
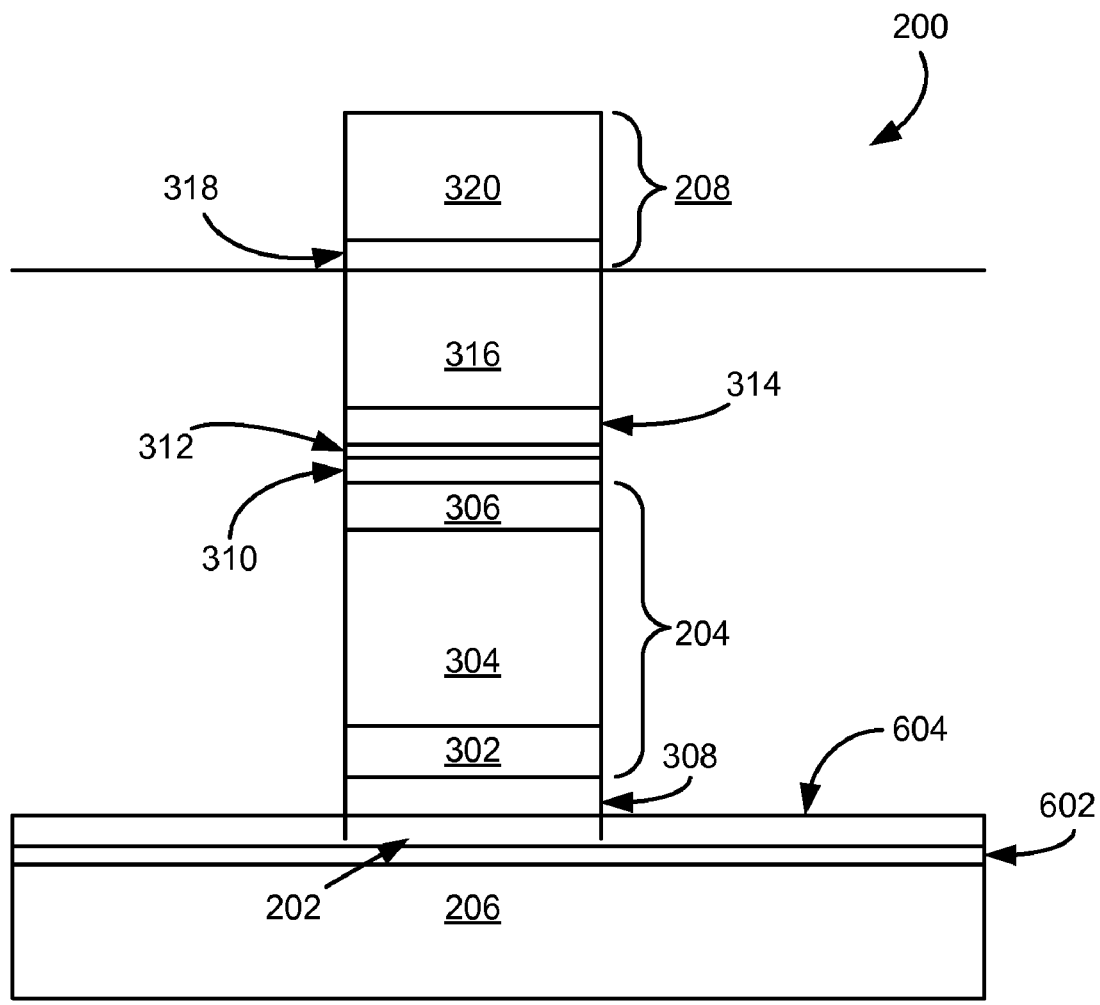
FIG. 6 is a cross sectional view of a second alternative memory cell provided in accordance with the present invention.

FIG. 6 is a cross sectional view of an exemplary memory cell 600 provided in accordance with the present invention. The memory cell 600 is similar to the memory cell 200 of FIG. 3, with the exception that the reversible resistance-switching element 202 is formed below the diode 204. Specifically, as shown in FIG. 6, the reversible resistance-switching element 202 is formed by selectively depositing a conductive material 602 on the patterned and etched bottom conductor 206. The conductive material 602 then may be annealed and/or oxidized if necessary, in accordance with the present invention, to form a reversible resistivity-switching material 604 for use in memory cell 600. For example, the conductive material 602 may include a layer of Ni, $Ni_xP_y$, NiO, $NiO_x$, $NiO_xP_y$, Nb, Ta, V, Al, Ti, Co, cobalt-nickel alloy, etc., selectively deposited, such as by electroplating, and oxidized to form the reversible resistivity-switching material layer 604. A portion of the reversible resistivity-switching material layer 604 that vertically overlaps and/or aligns with the diode 204 may serve as the reversible resistance-switching element 202 between the diode 204 and the first conductor 206 of the memory cell 600. In some embodiments, only a portion, such as one or more filaments, of the reversible resistance-switching element 202 may switch and/or be switchable. Because the layer 604 is selectively deposited on the already patterned and etched bottom conductor 206, the reversible resistivity-switching material layer 604 does not require etching.

The foregoing description discloses only exemplary embodiments of the invention. Modifications of the above disclosed apparatus and methods which fall within the scope of the invention will be readily apparent to those of ordinary skill in the art. For instance, although the present invention has been described primarily with regard to selective deposition of nickel and nickel oxide, it will be understood that other materials may be selectively deposited for use in a reversible resistance-switching element such as Ta, Nb, Al, V, Co, cobalt-nickel alloy, Ti, etc., forming, for example, $Ta_2O_5$, $Nb_2O_5$, $Al_2O_3$, $V_2O_5$, CoO, $(Co_xNi_y)O_z$, and $TiO_2$.

Accordingly, while the present invention has been disclosed in connection with exemplary embodiments thereof, it should be understood that other embodiments may fall within the spirit and scope of the invention, as defined by the following claims.

The invention claimed is:

1. A method of forming a memory cell comprising:
    forming a steering element above a substrate; and
    selectively forming a reversible resistance-switching element coupled to the steering element using a selective deposition process without etching the reversible resistance-switching element by:
    a) forming a conductive layer;
    b) etching the conductive layer to form an etched surface; and
    c) depositing the reversible resistance-switching element on the etched surface using any one of an electroless deposition or an electroplating process.

2. The method of forming a memory cell according to claim 1 wherein forming the steering element comprises forming a diode.

3. The method of forming a memory cell according to claim 1 wherein forming the steering element comprises forming a polycrystalline diode.

4. The method of forming a memory cell according to claim 1 wherein forming the steering element comprises forming a vertical polycrystalline diode.

5. The method of forming a memory cell according to claim 1 wherein forming the steering element comprises forming a vertical polycrystalline diode having polycrystalline material that is in a low-resistivity state.

6. The method of forming a memory cell according to claim 1 wherein forming the steering element comprises forming a p-n diode or a p-i-n diode.

7. The method of forming a memory cell according to claim 1 wherein forming the steering element comprises forming a thin film transistor.

8. The method of forming a memory cell according to claim 1 wherein forming the steering element comprises forming a thin film, metal oxide semiconductor field effect transistor (MOSFET).

9. The method of forming a memory cell according to claim 1 wherein forming the reversible resistance-switching element comprises forming at least one of NiO, $NiO_x$, and $NiO_xP_y$.

10. The method of forming a memory cell according to claim 9 wherein forming the reversible resistance-switching element comprises forming a reversible resistance-switching element having an oxide thickness of about 1000 angstroms or less.

11. The method of forming a memory cell according to claim 10 wherein forming the reversible resistance-switching element comprises forming a reversible resistance-switching element having an oxide thickness of about 500 angstroms or less.

12. The method of forming a memory cell according to claim 1 wherein forming the reversible resistance-switching element comprises selectively forming a nickel-containing layer.

13. The method of forming a memory cell according to claim 12 wherein forming the nickel-containing layer comprises selectively forming a NiO—, $NiO_x$— or $NiO_xP_y$-containing layer.

14. The method of forming a memory cell according to claim 13 further comprising annealing or oxidizing the NiO—, $NiO_x$— or $NiO_xP_y$-containing layer.

15. The method of forming a memory cell according to claim 12 wherein forming the nickel-containing layer comprises selectively forming a Ni or $Ni_xP_y$ layer and further comprising oxidizing the Ni or $Ni_xP_y$ layer.

16. The method of forming a memory cell according to claim 1 further comprising coupling the steering element and reversible resistance-switching element in series.

17. The method of forming a memory cell according to claim 1 wherein forming the reversible resistance-switching element comprises forming at least one of $Ta_2O_5$, $Nb_2O_5$, $Al_2O_3$, $V_2O_5$, CoO, $(Co_xNi_y)O_z$, and $TiO_2$.

18. A method of forming a memory cell comprising:
    forming a thin film transistor having a source region and a drain region above a substrate;
    forming a first conductor coupled to the source region or the drain region of the transistor;

selectively forming a reversible resistance-switching element without etching the reversible resistance-switching element, the reversible resistance-switching element including a nickel oxide layer above the first conductor and coupled to the thin film transistor, wherein selectively forming the reversible resistance switching element includes:

a) forming a conductive layer;
b) etching the conductive layer to form an etched surface; and
c) depositing the reversible resistance-switching element on the etched surface using any one of an electroless deposition or an electroplating process; and forming a second conductor above the reversible resistance-switching element.

19. The method of forming a memory cell according to claim 18 wherein forming the thin film transistor comprises forming an n-channel or a p-channel thin film, metal oxide semiconductor field effect transistor.

20. The method of forming a memory cell according to claim 18 wherein selectively forming the reversible resistance-switching element comprises forming a reversible resistance-switching element having an oxide thickness of about 500 angstroms or less.

* * * * *